May 29, 1973 H. FISCHER ET AL 3,736,180
METHOD OF PRODUCING SOLAR CELLS
Filed Nov. 10, 1970
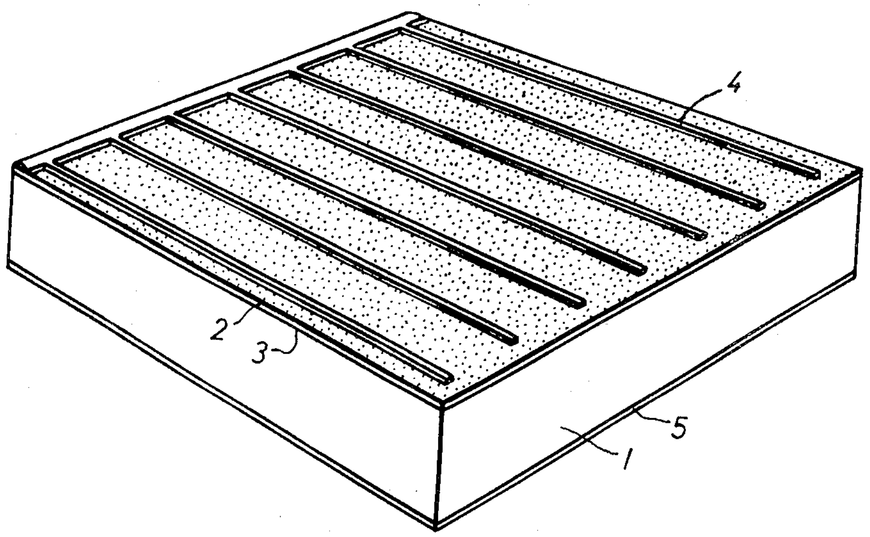
*Inventors:*
Horst Fischer
Reinhard Gereth
Karl-Heinz Kreuzer
BY Spencer & Kaye
ATTORNEYS.

United States Patent Office 3,736,180

Patented May 29, 1973

3,736,180

METHOD OF PRODUCING SOLAR CELLS

Horst Fischer, Reinhard Gereth, and Karl-Heinz Kreuzer, Heilbronn, Germany, assignors to Licentia Patent-Verwaltungs-G.m.b.H., Frankfurt am Main, Germany Filed Nov. 10, 1970, Ser. No. 88,445
Claims priority, application Germany, Nov. 17, 1969, P 19 57 659.1
Int. Cl. C23b *5/50;* H01l *15/02*
U.S. Cl. 117—217 4 Claims

ABSTRACT OF THE DISCLOSURE

A method of producing solar cells includes subjecting the back contacts of the cells to a separate intensified intermediate sintering prior to the application of the front contact.

BACKGROUND OF THE INVENTION

The invention relates to a method of producing solar cells.

Solar cells are silicon photoelectric cells which permit a direct conversion of radiant energy into electrical energy. Because they are used primarily in order to utilize solar radiation as a source of energy for generating electrical current, such photoelectric cells are generally called "solar cells." They serve as a source of current in some technical fields, for example in space travel and for supplying earth satellites, that is to say, preferably in regions where, because of the absence of clouds, there is substantially complete utilization of the solar radiation.

With the low voltage of an individual cell, only a series connection can be considered for the majority of applications. For use in practice, there are certain electrical and optical requirements regarding the quality of the cells. Thus the no-load voltage should reach 550 mv., and the maximum power should exceed 58.5 mw. or at least reach it. The current-voltage characteristic of the back contact should deviate as little as possible from linearity, even during illumination.

It is known that the quality of the load characteristic depends strongly on the quality of the contact-making. It is likewise known to improve this quality by subjecting the contacts, for which titanium-silver contacts may advantageously be used for example, to sintering after the vapour-deposition. This sintering effects both the front contact and the back contact, the front side of the solar cell generally being understood to mean the side through which the light radiation, which produces the free charge carriers, penetrates into the cell.

SUMMARY OF THE INVENTION

It is the object of the invention, to improve the quality of contact-making and so to increase the production yield of solar cells of high quality, in which the main interest lies.

According to the invention, there is provided a method of producing solar cells comprsing the step of applying a back contact to the cell and subjecting said back contact to a separate intensified intermediate sintering prior to the application of a front contact.

DESCRIPTION OF THE PREFERRED EMBODIMENTS

The method of the invention resides in that, before the front contact is applied, the back contact is subjected to a separate, intensified intermediate sintering.

As a result of the method according to the invention, the effect is achieved that the ohmic contact is improved and so the contact resistance is reduced, which in turn leads to the required increase in the no-load voltage of the solar cells—by about 10 mv. Since the intermediate sintering only applies to the back contact, however, damage to the p-n junction situated just below the surface of the front contact is out of the question.

Experiments have shown that the production yield of high-quality solar cells could be substantially trebled by the intermediate sintering of the back contact according to the invention.

Referring now to the drawing, there is shown the construction of a so-called n-type on p-type solar cell which consists of a semiconductor body 1 of silicon of p-type conductivity in one surface of which a n-type region 2 is indiffused. The p-type doping of the silicon substrate is obtained, for example, by the introduction of boron, while the n-type region 2 may be produced, for example, by the indiffusion of phosphorus. The n-type region 2 may have a thickness of $0.3\mu$ for example. Between the n-type region 2 and the portion of the semiconductor substrate excluded from the diffusion there is formed the p-n junction 3 necessary for the solar cell. The dimensions of the silicon body 1 may amount, for example, to 2 cm. x 2 cm. x 0.33 mm. The invention may likewise be used for so-called p-type on n-type solar cells wherein the p-type region is produced by diffusion instead of the n-type region.

As the drawing further shows, contact is made to the two semiconductor regions 1 and 2 forming the p-n junction by means of electrodes. Thus one electrode is provided at the front and one at the back of the solar cell, and the electrode which is at the front, which makes contact to the n-type region 2 is termed the front contact 4, while the electrode at the back of the semiconductor body, which is provided on the semiconductor substrate and hence on the p-type region 1 is termed back contact 5. Both the front contact 4 and the back contact 5 consist, for example of the same material. Such material can be a first component of titanium on the semiconduuctor surface, a second component of palladium, and a third component of silver, The first and the second component can be replaced by a layer of titanium which could be in the form of a titanium-palladium alloy. The back contact 5 is subjected to a separate, intensified intermediate sintering, prior to the application of front contact.

It has proved a particular advantage to carry out the the intermediate sintering of the back contact in a temperature time range between about 5 minutes at 620° C. and 7 minutes at 600° C. after the sintering temperature was reached in about 5 minutes heating time. The front contact, on the other hand, is only sintered briefly and at a lower temperature, about 5 minutes at 580° C. (including the heating-up time).

About 100 litres of argon per hour and about 0.4 litre of hydrogen per hour are conveyed through the sintering furnace as a protective gas during the sintering.

It will be understood that the above description of the present invention is susceptible to various modifications, changes and adaptations.

What is claimed is:

1. In a method of producing solar cells the improvement comprising the step of applying a back contact consisting of a layer containing titanium and a layer of silver or a layer containing titanium, a layer of palladium, and a layer of silver to the cell and subjecting said back contact to a separate intensified intermediate sintering prior to the application of a front contact.

2. A method as defined in claim 1, wherein said intermediate sintering carried out in a temperature time range of from 5 minutes at 620° C. to 7 minutes at 600° C.

3. A method as defined in claim 2, wherein a heating up time of about 5 minutes is required to reach the sintering temperature.

4. A method as defined in claim 2, further comprising carrying out said intermediate sintering in a sintering furnace and conveying about 100 litres of argon and about 0.4 litre of hydrogen per hour through said sintering furnace during the sintering.

References Cited

UNITED STATES PATENTS

| | | | |
|---|---|---|---|
| 3,453,501 | 7/1969 | Dunkle | 117—227 X |
| 3,434,885 | 3/1969 | Mandelkorn | 136—89 |
| 3,567,508 | 3/1971 | Cox et al. | 117—212 |

FOREIGN PATENTS

| | | |
|---|---|---|
| 1,283,975 | 11/1968 | Germany. |

OTHER REFERENCES

RCA Tech. Notes, TN No. 8. Aug. 9, 1957.

M. F. ESPOSITO, Assistant Examiner
ALFRED L. LEAVITT, Primary Examiner

U.S. Cl. X.R.

117—227; 136—89; 317—234 L, 234 M